US009252715B2

(12) United States Patent
Jones et al.

(10) Patent No.: US 9,252,715 B2
(45) Date of Patent: Feb. 2, 2016

(54) SYSTEM AND METHOD FOR ADAPTIVE LINEARIZATION OF RF AMPLIFIERS

(71) Applicants: Jeffrey K. Jones, Chandler, AZ (US); Paul R. Hart, Phoenix, AZ (US); Michael E. Watts, Scottsdale, AZ (US)

(72) Inventors: Jeffrey K. Jones, Chandler, AZ (US); Paul R. Hart, Phoenix, AZ (US); Michael E. Watts, Scottsdale, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 92 days.

(21) Appl. No.: 14/211,068

(22) Filed: Mar. 14, 2014

(65) Prior Publication Data

US 2015/0263677 A1 Sep. 17, 2015

(51) Int. Cl.
*H03F 3/68* (2006.01)
*H03F 1/02* (2006.01)
*H03F 3/19* (2006.01)
*H03F 3/21* (2006.01)

(52) U.S. Cl.
CPC ............... *H03F 1/0288* (2013.01); *H03F 3/19* (2013.01); *H03F 3/211* (2013.01); *H03F 3/68* (2013.01); *H03F 2200/273* (2013.01); *H03F 2200/451* (2013.01); *H03F 2200/555* (2013.01)

(58) Field of Classification Search
CPC ......... H03F 3/211; H03F 3/602; H03F 3/604; H03F 3/72; H03F 1/0288; H03F 3/24; H03F 2200/451
USPC ............................................. 330/124 R, 295
See application file for complete search history.

(56) References Cited

U.S. PATENT DOCUMENTS

| | | | |
|---|---|---|---|
| 6,005,442 A * | 12/1999 | Maeda et al. | 330/295 |
| 6,819,184 B2 | 11/2004 | Pengelly et al. | |
| 7,570,935 B2 | 8/2009 | Na et al. | |
| 2010/0194473 A1 * | 8/2010 | Wright | 330/124 R |
| 2011/0241782 A1 * | 10/2011 | Clifton | 330/295 |

OTHER PUBLICATIONS

Raymond S. Pengelly, Improving the Linearity and Efficiency of RF Power Amplifiers, High Frequency Electronics, 2002, pp. 26, 28, 30-32, and 34.
M.P. Van Der Heijden et al., Ultra-Linear Distributed Class-AB LDMOS RD Power Amplifier for Base Stations, IEEE MTT-S Digest, 2001, pp. 1363-1366.

* cited by examiner

*Primary Examiner* — Khanh V Nguyen

(57) ABSTRACT

A variable-bias power amplifier is provided, comprising: a first variable voltage source generating first bias voltages based on bias control signals; a first amplifier circuit amplifying an output RF signal to generate a first amplified signal based on the first bias voltages; a second variable voltage source generating second bias voltages based on the bias control signals; a second amplifier circuit amplifying the output RF signal to generate a second amplified signal based on the second bias voltages; and a DC isolation circuit between the first amplifier circuit and the second amplifier circuit, electrically isolating DC currents at the first amplifier from DC currents at the second amplifier, wherein the first variable voltage source can be controlled independently from the second variable voltage source, and the first amplifier circuit, the second amplifier circuit, and the DC isolation circuit are all formed on a single die.

20 Claims, 4 Drawing Sheets

__US 9,252,715 B2__

SYSTEM AND METHOD FOR ADAPTIVE LINEARIZATION OF RF AMPLIFIERS

FIELD OF THE INVENTION

The present invention relates to a system and method for adaptive linearization of a radio frequency (RF) amplifier. More particularly, the present invention relates to a system and method for adaptively changing multiple bias voltages in a multiple-path RF power amplifier.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

BACKGROUND OF THE INVENTION

Amplifiers are used in a variety of applications, including devices that transmit and receive wireless signals. One particular type of power amplifier often used in radio frequency (RF) communication transceiver circuits is the Doherty amplifier.

The Doherty amplifier power-combines two separate amplifiers: a carrier amplifier and a peaking amplifier, each of which is biased differently. The carrier amplifier operates as a normal class AB amplifier, while the peaking amplifier operates as class C amplifier. An RF input signal is split (e.g., using a quadrature coupler), and is sent to both the carrier amplifier and the peaking amplifier, which separately operate to amplify their respective inputs. The outputs of the carrier amplifier and the peaking amplifier are then combined to provide a final amplified signal. In operation, the carrier amplifier operates most of the time, handling average input signals, while the peaking amplifier operates only when peak power is needed.

The design of amplifiers (including power amplifiers) typically involves trade-offs in various device parameters. In general, device technology process optimization involves trade-off of competing parameters such as power, density, gain, efficiency, and linearity. Often, improving the power density is a direct trade-off for linearity. In an amplifier, power density is important for minimizing the drain-source capacitance ($C_{ds}$) and the gate-source capacitance ($C_{gs}$) per watt of the amplifier. This allows for improved bandwidth, and also allows more power to be used in a given circuit footprint, which, in turn, can lead to cost reduction in constructing the amplifier.

Linear amplifiers that are used in amplifier architectures such as a Doherty amplifier generally require good linearity in their operation. This is because in a Doherty amplifier, the carrier amplifier must operate the majority of the time of a load state at close to maximum efficiency, which corresponds to the worst-case linearity for the amplifier. Furthermore, in Doherty amplifiers the peaking amplifier must operate in class C or low class B, which also degrades linearity.

Conventional amplifiers use a single, constant gate and drain voltage fed to an entire die and/or die fingers in a given amplifier path. However, different circuit elements of different positions on the die do not operate identically, this can lead to a loss in linearity. For example, RF current density will be higher at the outer edges of package leads, meaning that center paths are not equivalent to edge die pads. This is also true from a thermal standpoint where temperature gradients of 40° C. or higher are possible.

It would therefore be desirable to provide a way to improve the linearity of RF amplifier circuits, while minimizing the associated loss of power density.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, may be supported with or in integrated circuits (ICs, or the like. In particular, they may be implemented using CMOS transistors. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs will be limited to the essentials with respect to the principles and concepts used by the exemplary embodiments.

Radio Frequency Transceiver Circuit

Figure 1:
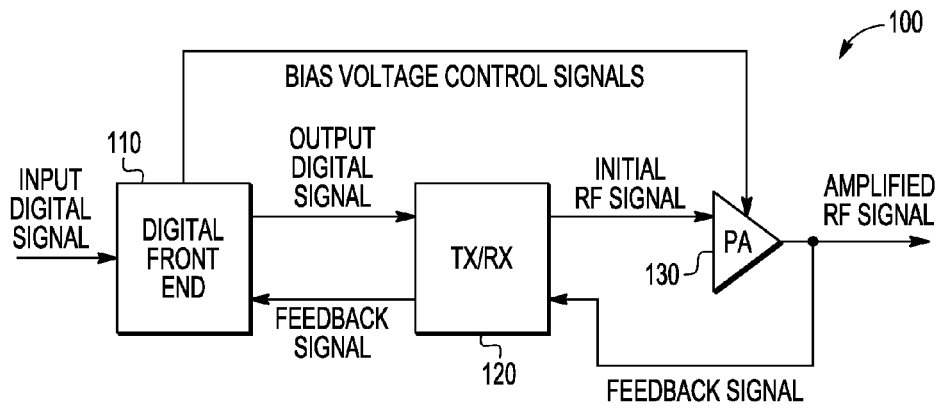
FIG. 1 is a block diagram of an RF signal receiver circuit according to disclosed embodiments.

FIG. 1 is a block diagram of a radio frequency (RF) signal transceiver circuit 100 according to disclosed embodiments. As shown in FIG. 1, the transceiver circuit 100 includes an analog front end 110, a transmitter/receiver circuit 120, and a power amplifier 130.

The digital front end 110 operates to perform various signal processing operations between an antenna and baseband circuitry. This can include converting the digital signal from baseband to radio frequency or vice versa, filtering, and otherwise preparing a digital signal for digital-to-analog conversion in the transmitter/receiver circuit 120. Digital front end 110 also generates bias voltage control signals based on a feedback signal received from the power amplifier 130. These bias voltage control signals instruct the power amplifier 130 on what bias voltage should be used.

The transmitter/receiver circuit 120 operates to transmit or receive digital signals generated from the digital front end 110. This includes digital-to-analog conversion of a signal received from the digital front end 110.

The power amplifier 130 operates to amplify an initial RF signal into an amplified RF signal. One way this can be accomplished is to split the initial RF signal into multiple RF input signals, provide these multiple RF input signals to individual amplifier circuits on the power amplifier 130 to generate multiple RF output signals, and then combine those multiple RF output signals to form the amplified RF signal. The amplified output RF signal is then provided to digital front end 110 through the transmitter/receiver circuit 120 (which can performs analog-to-digital conversion, as needed) as a feedback signal.

Individual amplifier circuits within the power amplifier 130 each receive a bias voltage that controls the operation of transistors within these individual amplifier circuits. The values of these bias control voltages are regulated by the bias voltage control signals generated by the digital front end 110. In particular, the bias voltage control signals instruct the power amplifier 130 as to what bias voltages to use.

Power Amplifier Circuit

Figure 2:
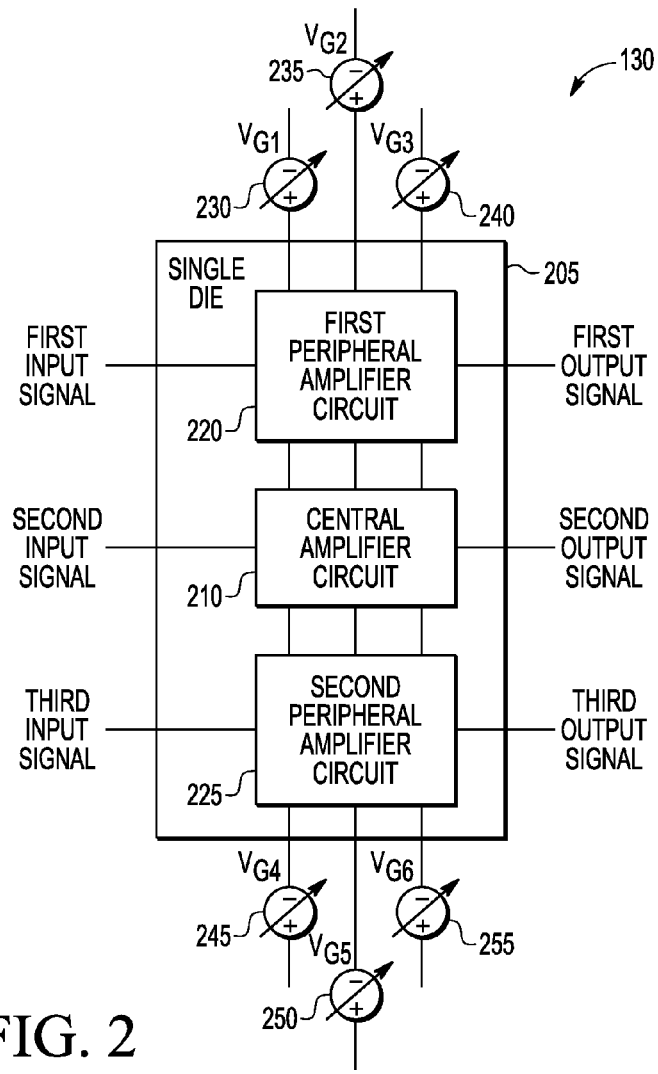
FIG. 2 is a block diagram of the power amplifier circuit of FIG. 1 according to disclosed embodiments.

FIG. 2 is a block diagram of the power amplifier circuit 130 of FIG. 1 according to disclosed embodiments. As shown in FIG. 2, the power amplifier circuit 130 includes a single die 205 and first through sixth variable voltage generators 230, 235, 240, 245, 250, 255. The single die 205 contains a central amplifier circuit 210, and first and second peripheral amplifier circuits 220, 225.

The first peripheral amplifier circuit 220 receives a first input signal, and amplifies it to generate an amplified first output signal.

The central amplifier circuit 210 receives a second input signal, and amplifies it to generate an amplified second output signal.

The second peripheral amplifier circuit 225 receives a third input signal, and amplifies it to generate an amplified third output signal.

The first through sixth variable voltage generators 230, 235, 240, 245, 250, 255 operate to provide variable bias voltages to the central amplifier circuit 210, the first peripheral amplifier circuit 220, and the second peripheral amplifier circuit 225. The magnitudes of these variable bias voltages are controlled by the bias voltage control signals sent to the power amplifier circuit 130 from the digital front end 110.

The first through sixth variable voltage generators 230, 235, 240, 245, 250, 255 can be formed on the die. In one embodiment, some of the first through sixth variable voltage generators 230, 235, 240, 245, 250, 255 are formed on one side of the die, and the other of the first through sixth variable voltage generators 230, 235, 240, 245, 250, 255 are formed on the side of the die.

Although six variable voltage generators 230, 235, 240, 245, 250, 255 are shown in this embodiment, this is by way of example only. Alternate embodiments can have more or fewer variable voltage generators to provide bias voltages to the amplifier circuits 210 in the power amplifier circuit 130.

Figure 3:
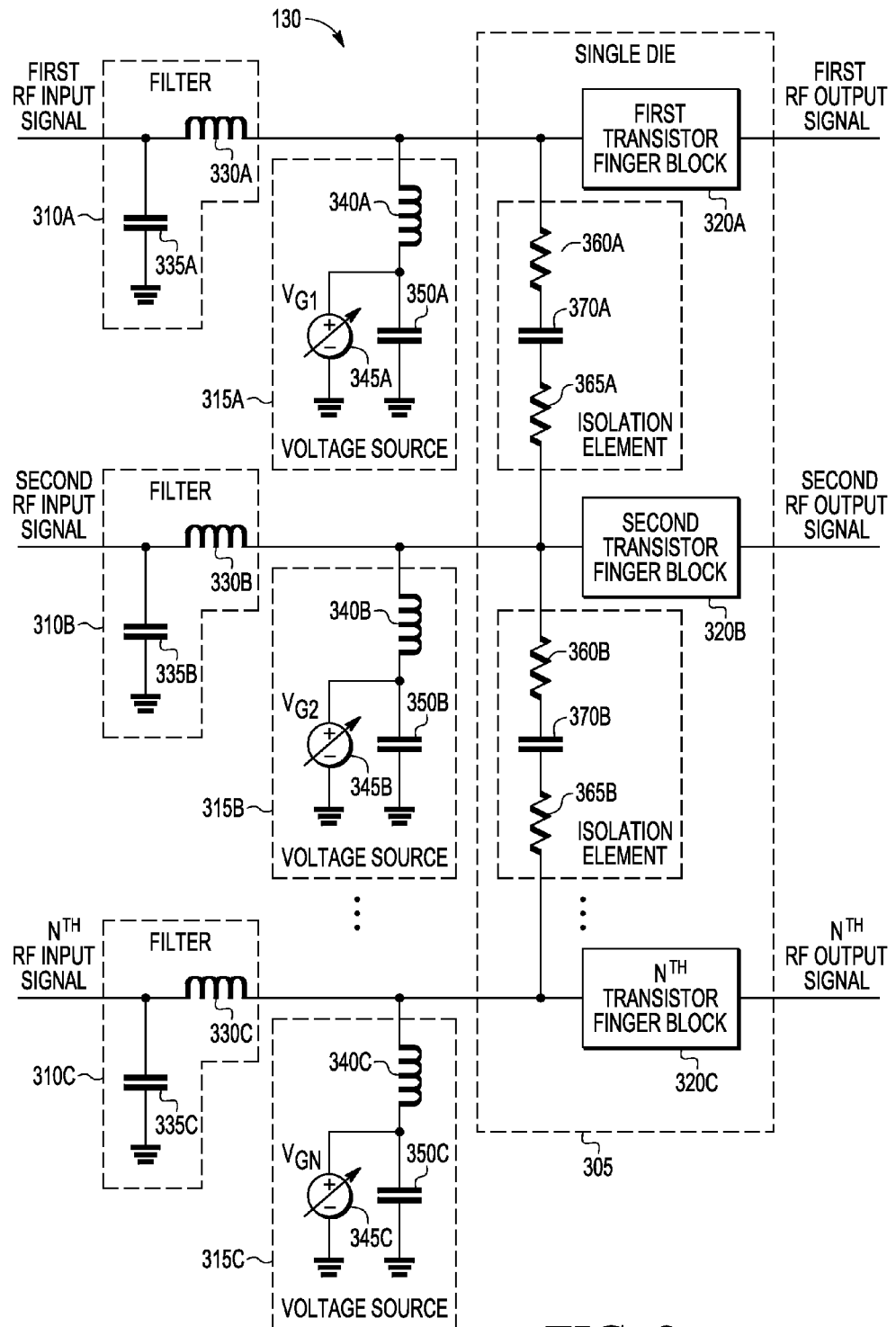
FIG. 3 is a circuit diagram of the power amplifier circuit of FIG. 1 according to disclosed embodiments.

FIG. 3 is a circuit diagram of the power amplifier circuit 130 of FIG. 1 according to disclosed embodiments. As shown in FIG. 3, the power amplifier circuit 130 includes a single die 305, first through $N^{th}$ filters 310A, 310B, 310C, and first through $N^{th}$ variable voltage sources 315A, 315B, 315C. The single die 305 contains first through $N^{th}$ transistor finger blocks 320A, 320B, 320C, and first through $(N-1)^{th}$ isolation elements 325A, 325B. Each of the first through $N^{th}$ filters 310A, 310B, 310C includes a filtering inductor 330A, 330B, 330C and a filtering capacitor 335A, 335B, 335C. Each of the first through $N^{th}$ variable voltage sources 315A, 315B, 315C includes a bias inductor 340A, 340B, 340C, a variable voltage generator 345A, 345B, 345C, and a bias capacitor 350A, 350B, 350C. Each of the first through $(N-1)^{th}$ isolation elements 325A, 325B contains a first isolation resistance 360A, 360B, a second isolation resistance 365A, 365B, and an isolation capacitor 370A, 370B. In this embodiment, N is an integer greater than 2.

For ease of disclosure, the filters 310A, 310B, 310C can be referred to generically as filters 310; the variable voltage sources 315A, 315B, 315C can be referred to generically as variable voltage sources 315; the transistor finger blocks 320A, 320B, 320C can be referred to generically as transistor finger blocks 320; the isolation elements 325A, 325B can be referred to generically as isolation elements 325; the filtering inductors 330A, 330B, 330C can be referred to generically as filtering inductors 330; the filtering capacitors 335A, 335B, 335C can be referred to generically as filtering capacitors 335; the bias inductors 340A, 340B, 340C can be referred to generically as bias inductors 340; the variable voltage generators 345A, 345B, 345C can be referred to generically as variable voltage generators 345; the bias capacitors 350A, 350B, 350C can be referred to generically as bias capacitors 350; the first isolation resistances 360A, 360B can be referred to generically as first isolation resistances 360; the second isolation resistances 365A, 365B can be referred to generically as second isolation resistances 365; and the isolation capacitors 370A, 370B can be referred to generically as isolation capacitors 370.

The initial RF signal received from the transmitter/receiver circuit 120 is split into first through $N^{th}$ RF input signals (i.e., a first RF input signal, a second RF input signal, ... an $N^{th}$ RF input signal). These first through $N^{th}$ RF input signals are provided to the first through $N^{th}$ filters 310A, 310B, 310C, respectively, which operate to attenuate the first through $N^{th}$ RF input signals as necessary.

In the disclosed embodiment, the filters 310 are low-pass LC filters that each include a filtering inductor 330 and a filtering capacitor 335 in parallel. However, alternate embodiments could employ different filters to provide different filtering characteristics, as required by different devices. For example, in alternate embodiments, the filters 310 could be high-pass filters, bandpass filters, or any desirable RF filter.

The variable voltage sources 315 each provide a bias voltage to the input of a corresponding transistor finger block 320. These variable voltage sources 315 are controlled by the bias voltage control signals sent by the digital front end 110.

In the disclosed embodiment each variable voltage source 315 includes a bias inductor 340 and a bias capacitor 350 connected in series between the input of a corresponding transistor filter block 320 and ground. A variable voltage generator 345 is then connected between ground and the node where the bias inductor 340 and the bias capacitor 350 meet. The variable voltage generator 345 is controlled by the bias control signals sent by the digital front end 110.

However, this design for a variable voltage source 315 is not meant to be limiting. Alternate embodiments may employ different implementations of a circuit that provides a variable bias voltage.

In various embodiments, the voltage sources 315 can be attached to the single die 305. In particular, they can be formed on either side of the die. In some particular embodiments, different voltage sources 315 can be formed on different sides of the single die 305. For example, first, third, etc. voltage sources 315 can be formed on one side of the single die 305, while second, fourth, etc. voltage sources 315 can be formed on the other side of the single die 305

Each transistor finger block 320 operates to amplify a corresponding input RF signal to generate an amplified output RF signal. The first through $N^{th}$ output signals can then be combined to form the amplified output RF signal.

Although in the embodiment of FIG. 3, amplifier circuits are formed as transistor finger blocks 320, this is by way of example only. In alternate embodiments other amplifying circuits could be used.

The isolation elements 325 serve to electrically isolate adjacent transistor finger blocks 320 from each other. In the power amplifier 130, an isolation element 325 is located between each pair of adjacent transistor finger blocks 320. In this way, each transistor finger block 320 is electrically isolated from the DC bias voltages of adjacent transistor finger blocks 320. As a result, each transistor finger block 320 can receive a different bias voltage at its input, and can therefore be controlled independently.

In the disclosed embodiment, an isolation element 325 includes first and second resistances 360, 365, and a capacitor 370, all in series, with the capacitor 370 between the first and second resistances 360, 365. However, in alternate embodiments different isolation circuits could be used as isolation elements 325 to electrically isolate adjacent transistor finger blocks 320. All that is necessary is that the isolation circuits be able to isolate DC voltages.

Although in the embodiments shown above in FIGS. 1-3, a single initial output RF signal may split to form first through $N^{th}$ RF input signals, this is by way of example only. In alternate embodiments any variety of signals could be provided to each of the amplifier circuits 210, 220, 225, 320. For example, each RF input signal could be a separate signal received from the transmitter/receiver circuit 120, or some of the RF input signals could be individual signals, while others are portions of a split signal.

Likewise, although in the embodiments shown above in FIGS. 1-3, the first through $N^{th}$ RF output signals may be combined to form a single amplified output RF signal, this is only by way of example. In alternate embodiments the various RF output signals can be maintained separately or combined in whole or in part. For example, each RF output signal could be a separate output signal, or some RF output signals could be individual signals, while others are combined to form a combined RF output signal. In each case, the final amplified RF signals would be provided as one or more feedback signals to the digital front end 110.

One particular amplifier embodiment is a Doherty amplifier in which two initial RF signals are provided, and two amplified RF signals are generated. One such implementation could have two amplifier blocks. In such an implementation, first and second initial RF signals (e.g., a carrier RF signal and a peaking RF signal) can be provided. These first and second initial RF signals can themselves be split into multiple signals (e.g., three signals each). A first amplifier block of three transistor finger blocks 320 can be arranged to receive first split input signals from the first initial RF signal (e.g., the carrier RF signal), amplify these first split input signals to generate first amplified output signals, and combine the first amplified output signals into a first amplified RF signal. Similarly, a second amplifier block of three transistor finger blocks 320 can then be arranged to receive second split input signals from the second initial RF signal (e.g., the peaking RF signal), amplify these second split input signals to generate a second amplified output signals, and combine the second amplified output signals into a second amplified RF signal.

By using different bias voltages for different amplifier circuits in different positions on a die, it is possible to get improved amplitude-to-amplitude (AM/AM) modulation or amplitude-to-phase (AM/PM) modulation, as compared to a device that provides for a single bias voltage for a given die, without loss of amplifier performance.

In particular, simulations were performed in a device similar to that shown in FIG. 2, in which two amplifier circuits at the periphery of a die were biased differently from an amplifier circuit in the center of the die. By plotting AM/AM, AM/PM, gain, and efficiency versus output power, these simulations showed either no significant loss of performance (for AM/AM modulation), or a 4% increase in performance (for AM/PM modulation), with no significant loss in gain and no degradation of efficiency.

Transistor Finger Block

Figure 4:
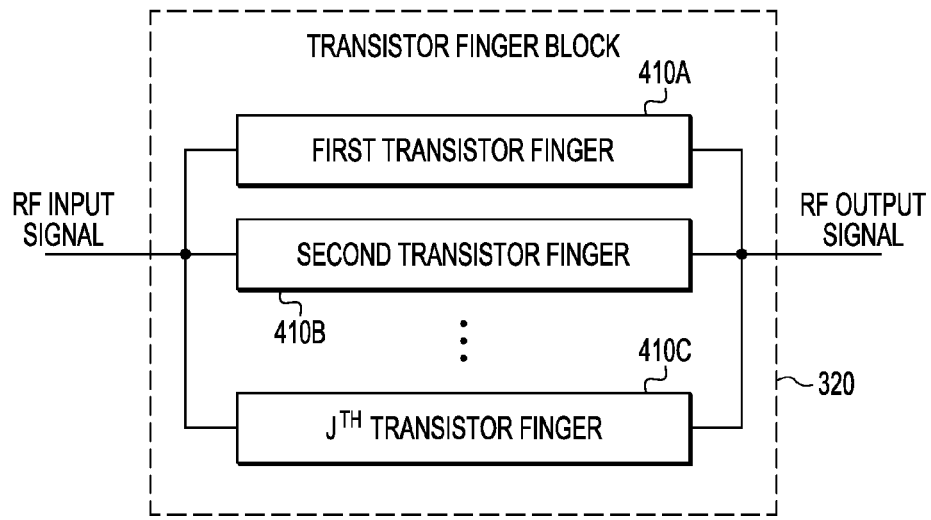
FIG. 4 is a block diagram of a transistor finger block of FIG. 3 according to disclosed embodiments.

FIG. 4 is a block diagram of a transistor finger block 320 of FIG. 3 according to disclosed embodiments. As shown in FIG. 4, the transistor finger block 320 includes first through $J^{th}$ transistor fingers 410A, 410B, 410C, where J is an integer greater than 2. For ease of disclosure, the transistor fingers 410A, 410B, 410C can be referred to generically as transistor fingers 410.

The first through $J^{th}$ transistor fingers 410A, 410B, 410C are arranged in parallel with each other. An RF input signal is input to each of these transistor fingers 410, and each transistor finger 410 operates to amplify the RF input signal. The amplified outputs of the multiple transistor fingers 410 are then combined to provide the output RF signal.

Since each transistor finger block 320 is electrically isolated from adjacent transistor finger blocks 320 by the isolation elements 325, the variable voltage sources 315 can provide different bias voltages for each transistor finger block 320. By carefully regulating these bias voltages, the digital front end 110 can improve the linearization of the entire power amplifier 130. This is, in part, because different transistor finger blocks 320 at different positions on the single die 205 may provide for different coupling/feeding environments. In particular, transistor finger blocks 320 near the periphery of the single die 205 may have different coupling/feeding environments than transistor finger blocks 320 closer to the center of the single die 205. More specifically, RF current density will be higher on outer edges of the die, as compared to inner portions of the die.

As a result, the operation of different transistor finger blocks 320 will not be equivalent. However, by providing separate, and changeable bias voltages to the individual transistor finger blocks 320, the disclosed signal transceiver circuit 100 can compensate for these different coupling/feeding environments.

Transistor Finger

Figure 5:
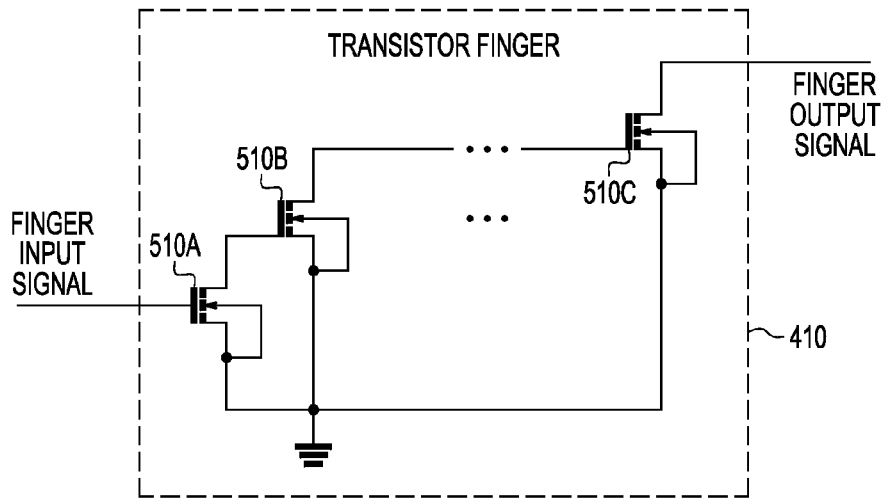
FIG. 5 is a circuit diagram of a transistor finger of FIG. 4 according to disclosed embodiments.

FIG. 5 is a circuit diagram of a transistor finger 410 according to disclosed embodiments. As shown in FIG. 5, the transistor finger 410 includes a plurality of transistors 510A, 510B, 510C arranged in series. For ease of disclosure, the transistors 510A, 510B, 510C can be referred to generically as transistors 510. In different embodiments, the number of transistors 510 in a transistor finger 410 vary. Some embodiment will employ a single transistor 510, while others can have multiple transistors 510 arranged in a cascade (as shown in FIG. 5), or in a cascode arrangement.

A first transistor 510A has its gate connected to the RF input signal, its source connected to ground, and its drain connected to the gate of the second transistor 510B. This pattern continues for each of the transistors 510, with each of them having its gate connected to the drain of the previous transistor in the series, its source connected to ground, and its drain connected to the gate of the next transistor in the series. Finally the last transistor 510C has its gate connected to the drain of the next-to-last transistor, its source connected to ground, and its drain providing the amplified output signal. If a single transistor 510 is used in the transistor finger 410, its gate will be connected to the RF input signal, its source will be connected to ground, and its drain will provide the amplified output signal.

Since the gate of the first transistor 510A is connected to a respective variable voltage source 315, that particular variable voltage source 315 will provide the bias voltage for the transistors 510 in the transistor finger 410.

Method of Operation of Power Amplifier

Figure 6:
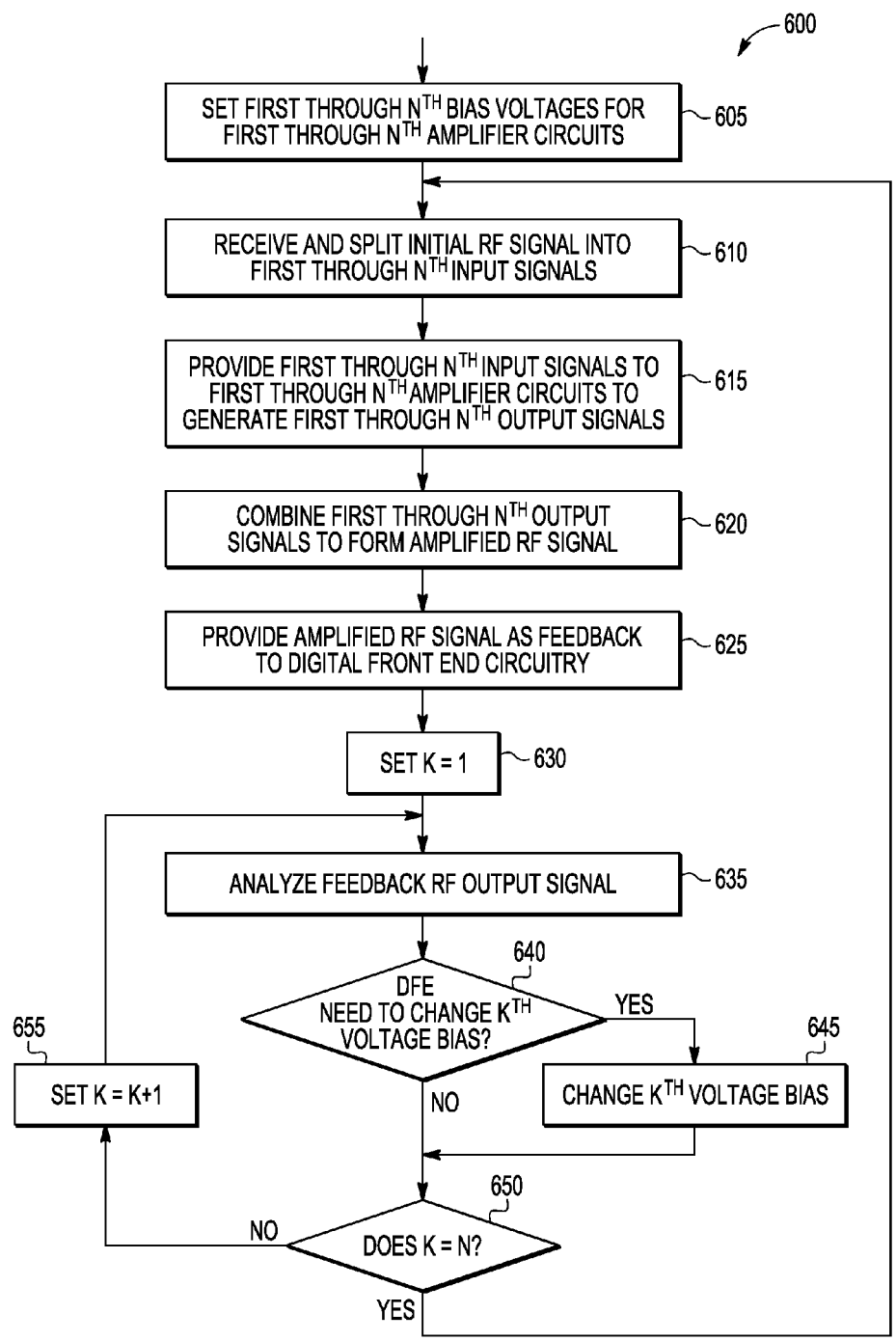
FIG. 6 is a flow chart of the operation of the RF signal transceiver circuit of FIG. 1 according to disclosed embodiments.

FIG. 6 is a flow chart of the operation 600 of the RF signal transceiver circuit 100 of FIG. 1 according to disclosed embodiments. As shown in FIG. 6, operation begins when the power amplifier 130 sets first through $N^{th}$ bias voltages for first through $N^{th}$ amplifier circuits to starting values. (605)

The power amplifier 130 then receives an initial RF input signal and splits it up into first through $N^{th}$ RF input signals. (610) In alternate embodiments, however, the first through $N^{th}$ RF input signals need not be parts of a split up signal. Some or all can be portions of another signal, while some or all can be unrelated signals.

The first through $N^{th}$ RF input signals are then provided to first through $N^{th}$ amplifier circuits, respectively, which amplify the first through $N^{th}$ RF input signals to generate first through $N^{th}$ RF output signals. (615)

The first through $N^{th}$ RF output signals are then combined to generate an amplified output RF signal. (620) In alternate embodiments, however, the first through $N^{th}$ RF output signals the not all be combined to generate a single amplified output RF signal. In these alternate embodiments, some or all can be provided as individual output signals, while some or all can be combined into other output signals.

This amplified output RF signal is then provided as feedback to the digital front end circuitry 110 as a feedback RF signal. (625) If multiple output signals are produced from the power amplifier 130, then all of the multiple output signals are provided to the digital front end circuitry 110 as feedback RF signals.

A value of an index K is then set to be equal to 1, corresponding to the first bias voltage. (630)

The digital front end circuitry 110 then proceeds to analyze the feedback RF output signal. (635) Based on this analysis, the digital front end circuitry 110 determines whether it is necessary to change the current bias voltage (i.e., the $K^{th}$ bias voltage). (640) In operation, the digital front end circuitry 110 can vary the various bias voltages in order to: (1) optimize the stage linearity of the power amplifier 130 (AM/AM, AM/PM); (2) optimized balance loading over voltage standing wave ratio (VSWR) conditions; (3) optimize power sharing in the power amplifier 130; (4) optimize thermal compensation in the power amplifier 130; (5) optimize dynamic adjustments under varying traffic conditions; and (6) optimize linearity over a range of drain voltages (e.g., in envelope tracking/drain modulation applications). The bias voltages can be modified based on a knowledge of how the bias voltage influences any of these parameters If it is necessary to change the current bias voltage (i.e., the $K^{th}$ bias voltage) based on the analysis of the feedback RF output signal, then the digital front end circuitry 110 will do so. (645)

If it is not necessary to change the current bias voltage (i.e., the $K^{th}$ bias voltage), the DFE will not alter the current bias voltage, but will determine whether K is equal to N (i.e., whether the last bias voltage has been analyzed). (650)

If K does not equal N, then the digital front end circuitry 110 will increment K by one (655), and will return to analyzing the feedback RF output signal (635) to determine whether the next bias voltage needs to be changed. (640)

If, however, K equals N (i.e., the last bias voltage has been analyzed), the digital front end circuitry 110 will then provide the first through $N^{th}$ bias voltages (changed or unchanged) to first through $N^{th}$ amplifier circuits to amplify first through $N^{th}$ input signals in order to generate first through $N^{th}$ output signals. (615) Processing will continue from that point as noted above.

Although FIG. 6 shows a counter K being used (630-655) to analyze and change the first through $N^{th}$ bias voltages, as necessary, alternate embodiments can analyze and change the first through $N^{th}$ bias voltages in different ways. For example, a counting-down counter could be used in some embodiments. Furthermore, it is not necessary to analyze the first through $N^{th}$ bias voltages in series. Alternate embodiments could analyze the first through $N^{th}$ bias voltages fully or partially in parallel.

General Description

A variable-bias power amplifier is provided, including: a first variable voltage source configured to generate one or more first bias voltages based on at least one of two or more bias voltage control signals; a first amplifier circuit configured to amplify an output RF signal to generate a first amplified signal based on the one or more first bias voltages; a second variable voltage source configured to generate one or more second bias voltages based on at least one of the two or more bias voltage control signals; a second amplifier circuit configured to amplify the output RF signal to generate a second amplified signal based on the one or more second bias voltages; and a first DC isolation circuit located between the first amplifier circuit and the second amplifier circuit, the first DC isolation circuit being configured to electrically isolate DC currents at the first amplifier from DC currents at the second amplifier, wherein the first variable voltage source can be controlled independently from the second variable voltage source, the first amplifier circuit, the second amplifier circuit, and the first DC isolation circuit are all formed on a single die.

The first variable voltage source may be formed on a first side of the single die, and the second variable voltage source may be formed on a second side of the single die opposite the first side.

The first amplified signal and the second amplified signal may be combined to form the amplified output signal.

The first amplifier circuit may include a plurality of transistor fingers arranged in parallel. The plurality of transistor fingers may each include a plurality of transistors arranged in series.

The first amplifier circuit and the second amplifier circuit may be of different sizes.

The variable-bias power amplifier may be a Doherty amplifier.

The variable-bias power amplifier may further include: third through $N^{th}$ variable voltage sources configured to generate one or more third bias voltages through one or more $N^{th}$ bias voltages based on the two or more bias voltage control signals; third through $N^{th}$ amplifier circuits configured to amplify the output RF signal to generate a third through $N^{th}$ amplified signals based on the one or more third bias voltages through the one or more $N^{th}$ bias voltages; and second through $(N-1)^{th}$ DC isolation circuits, each located between an adjacent pair of the second through $N^{th}$ amplifier circuits, the second through $(N-1)^{th}$ DC isolation circuits each being configured to electrically isolate DC currents at the corresponding adjacent pairs of the second through $N^{th}$ amplifiers, wherein the first through $N^{th}$ amplifier circuits, and the first through $(N-1)^{th}$ DC isolation circuits are all formed on a single die.

A variable-bias radio frequency (RF) amplifier is provided, including: a digital front end circuit configured to adjust an input RF signal to generate an adjusted input RF signal, and configured generate two or more bias voltage control signals; a receiver circuit configured to process the adjusted input RF signal to generate an initial output RF signal; and a power amplifier configured to amplify the initial output RF signal to generate an amplified output RF signal based on the two or more bias voltage control signals, the power amplifier including a first variable voltage source configured to generate one or more first bias voltages based on at least one of the two or more bias voltage control signals, a first amplifier circuit configured to amplify the initial output RF signal to generate a first amplified signal based on the one or more first bias voltages, a second variable voltage source configured to generate one or more second bias voltages based on at least one of the two or more bias voltage control signals, a second amplifier circuit configured to amplify the initial output RF signal to generate a second amplified signal based on the one or more second bias voltages, and a first DC isolation circuit located between the first amplifier circuit and the second amplifier circuit, the first DC isolation circuit being configured to electrically isolate DC currents at the first amplifier from DC currents at the second amplifier, wherein the first amplifier circuit, the second amplifier circuit, and the first DC isolation circuit are all formed on a single die, the first amplified signal and the second amplified signal are combined to form the amplified output signal, the amplified output signal is sent as a feedback signal to the digital front end circuit, the digital front end circuit is further configured to generate the two or more bias voltage control signals based on the feedback signal, and the first variable voltage source can be controlled independently from the second variable voltage source.

The first variable voltage source may be formed on a first side of the single die, and the second variable voltage source may be formed on a second side of the single die opposite the first side.

The first amplified signal and the second amplified signal may be combined to form the amplified output signal, The first amplifier circuit may include a plurality of transistor fingers arranged in parallel.

The plurality of transistor fingers may each include a plurality of transistors arranged in series.

The first amplifier circuit and the second amplifier circuit may be of different sizes.

The power amplifier may be a Doherty amplifier.

The power amplifier may further include third through $N^{th}$ variable voltage sources configured to generate one or more third bias voltages through one or more Nth bias voltages based on the two or more bias voltage control signals; third through $N^{th}$ amplifier circuits configured to amplify the initial output RF signal to generate a third through $N^{th}$ amplified signals based on the one or more third bias voltages through the one or more $N^{th}$ bias voltages; and second through $(N-1)^{th}$ DC isolation circuits, each located between an adjacent pair of the second through $N^{th}$ amplifier circuits, the second through $(N-1)^{th}$ DC isolation circuits each being configured to electrically isolate DC currents at the corresponding adjacent pairs of the second through $N^{th}$ amplifiers, wherein the first through $N^{th}$ amplifier circuits, and the first through $(N-1)^{th}$ DC isolation circuits are all formed on a single die.

A method of amplifying a radio frequency (RF) signal is provided, including: setting first through $N^{th}$ bias voltages on first through $N^{th}$ power amplifiers to first through $N^{th}$ initial bias voltage values, respectively; providing an RF signal from digital front end circuitry to the first through $N^{th}$ power amplifiers to generate an RF output signal; providing the RF output signal as a feedback signal to the digital front end circuitry; analyzing the feedback signal with respect to the first through $N^{th}$ bias voltages; determining whether the digital front end circuitry should change any of the first through $N^{th}$ bias voltages; and changing one or more of the first through $N^{th}$ bias voltages based on the determining operation.

The analyzing of the feedback signal with respect to the first through $N^{th}$ bias voltages may include one of: optimizing for linearity, optimizing for temperature, optimizing for gradient, or optimizing for power combining.

The method may further include: generating first through $N^{th}$ amplified RF signals at the first through $N^{th}$ power amplifiers; and combining the first through $N^{th}$ amplifier RF signals to form the RF output signal.

The setting of the first through $N^{th}$ bias voltages on the first through $N^{th}$ power amplifiers, and the generating of the RF output signal by the first through $N^{th}$ power amplifiers may both be performed on the same die.

Conclusion

As shown above, the disclosed variable-bias power amplifier, and related method provide a way to improve the linearity of RF amplifier circuits, while minimizing the associated loss of power density.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A variable-bias power amplifier, comprising:
a first variable voltage source configured to generate a first bias voltage based on at least one of two or more bias voltage control signals;
a first amplifier circuit configured to amplify an output RF signal to generate a first amplified signal based on the one or more first bias voltages;
a second variable voltage source configured to generate a second bias voltage based on at least one of the two or more bias voltage control signals;
a second amplifier circuit configured to amplify the output RF signal to generate a second amplified signal based on the one or more second bias voltages; and
a first DC isolation circuit located between the first amplifier circuit and the second amplifier circuit, the first DC isolation circuit being configured to electrically isolate DC currents at the first amplifier circuit from DC currents at the second amplifier circuit, wherein the first variable voltage source can be controlled independently from the second variable voltage source, the first amplifier circuit, the second amplifier circuit, and the first DC isolation circuit are all formed on a single die.

2. The variable-bias power amplifier of claim 1, the variable voltage source, wherein the first variable voltage source is formed on a first side of the single die, and the second variable voltage source is formed on a second side of the single die opposite the first side.

3. The variable-bias power amplifier of claim 1, wherein the first amplified signal and the second amplified signal are combined to form a single amplified output signal.

4. The variable-bias power amplifier of claim 1, wherein the first amplifier circuit comprises a plurality of transistor fingers arranged in parallel.

5. The variable-bias power amplifier of claim 4, wherein the plurality of transistor fingers each comprise a plurality of transistors arranged in series.

6. The variable-bias power amplifier of claim 1, wherein the first amplifier circuit and the second amplifier circuit have a different number of fingers.

7. The variable-bias power amplifier of claim 1, wherein the variable-bias power amplifier is a Doherty amplifier.

8. The variable-bias power amplifier of claim 1, further comprising:

third through $N^{th}$ variable voltage sources configured to generate one or more third bias voltages through one or more $N^{th}$ bias voltages based on the two or more bias voltage control signals;

third through $N^{th}$ amplifier circuits configured to amplify the output RF signal to generate a third through $N^{th}$ amplified signals based on the one or more third bias voltages through the one or more $N^{th}$ bias voltages; and second through $(N-1)^{th}$ DC isolation circuits, each located between an adjacent pair of the second through $N^{th}$ amplifier circuits, the second through $(N-1)^{th}$ DC isolation circuits each being configured to electrically isolate DC currents at the corresponding adjacent pairs of the second through $N^{th}$ amplifiers, wherein the first through $N^{th}$ amplifier circuits, and the first through $(N-1)^{th}$ DC isolation circuits are all formed on a single die, N is an integer greater than 3.

9. A variable-bias radio frequency (RF) amplifier, comprising:

a digital front end circuit configured to adjust an input RF signal to generate an adjusted input RF signal, and configured to generate two or more bias voltage control signals;

a receiver circuit configured to process the adjusted input RF signal to generate an initial output RF signal; and a power amplifier configured to amplify the initial output RF signal to generate an amplified output RF signal based on the two or more bias voltage control signals, the power amplifier including a first variable voltage source configured to generate a first bias voltage based on at least one of the two or more bias voltage control signals, a first amplifier circuit configured to amplify the initial output RF signal to generate a first amplified signal based on the one or more first bias voltages, a second variable voltage source configured to generate a second bias voltage based on at least one of the two or more bias voltage control signals, a second amplifier circuit configured to amplify the initial output RF signal to generate a second amplified signal based on the one or more second bias voltages, and a first DC isolation circuit located between the first amplifier circuit and the second amplifier circuit, the first DC isolation circuit being configured to electrically isolate DC currents at the first amplifier circuit from DC currents at the second amplifier circuit, wherein the first amplifier circuit, the second amplifier circuit, and the first DC isolation circuit are all formed on a single die, the first amplified signal and the second amplified signal are combined to form the amplified output RF signal, the amplified output RF signal is sent as a feedback signal to the digital front end circuit, the digital front end circuit is further configured to generate the two or more bias voltage control signals based on the feedback signal, and the first variable voltage source can be controlled independently from the second variable voltage source.

10. The variable-bias RF amplifier of claim 9, wherein the first variable voltage source is formed on a first side of the single die, and the second variable voltage source is formed on a second side of the single die opposite the first side.

11. The variable-bias RF amplifier of claim 9, wherein the first amplified signal and the second amplified signal are combined to form the amplified output signal.

12. The variable-bias RF amplifier of claim 9, wherein the first amplifier circuit comprises a plurality of transistor fingers arranged in parallel.

13. The variable-bias RF amplifier of claim 12, wherein the plurality of transistor fingers each comprise a plurality of transistors arranged in series.

14. The variable-bias RF amplifier of claim 9, wherein the first amplifier circuit and the second amplifier circuit are of different sizes.

15. The variable-bias power amplifier of claim 9, wherein the power amplifier is a Doherty amplifier.

16. The variable-bias RF amplifier of claim 9, wherein the power amplifier further includes third through $N^{th}$ variable voltage sources configured to generate one or more third bias voltages through one or more $N^{th}$ bias voltages based on the two or more bias voltage control signals;

third through $N^{th}$ amplifier circuits configured to amplify the initial output RF signal to generate a third through $N^{th}$ amplified signals based on the one or more third bias voltages through the one or more $N^{th}$ bias voltages; and second through $(N-1)^{th}$ DC isolation circuits, each located between an adjacent pair of the second through $N^{th}$ amplifier circuits, the second through $(N-1)^{th}$ DC isolation circuits each being configured to electrically isolate DC currents at the corresponding adjacent pairs of the second through $N^{th}$ amplifiers, wherein the first through $N^{th}$ amplifier circuits, and the first through $(N-1)^{th}$ DC isolation circuits are all formed on a single die, N is an integer greater than 3.

17. A method of amplifying a radio frequency (RF) signal, comprising:
- setting first through $N^{th}$ bias voltages on first through $N^{th}$ power amplifiers to first through $N^{th}$ initial bias voltage values, respectively;
- providing an RF signal from digital front end circuitry to the first through $N^{th}$ power amplifiers to generate an RF output signal;
- providing the RF output signal as a feedback signal to the digital front end circuitry;
- analyzing the feedback signal with respect to the first through $N^{th}$ bias voltages;
- determining whether the digital front end circuitry should change any of the first through $N^{th}$ bias voltages; and
- changing one or more of the first through $N^{th}$ bias voltages based on the determining operation,
- wherein
- N is an integer greater than 1.

18. The method of amplifying an RF signal of claim 17, wherein the analyzing of the feedback signal with respect to the first through $N^{th}$ bias voltages includes one of:
- optimizing for linearity, optimizing for temperature, optimizing for gradient, or optimizing for power combining.

19. The method of amplifying an RF signal of claim 17, further comprising:
- generating first through $N^{th}$ amplified RF signals at the first through $N^{th}$ power amplifiers;
- and combining the first through $N^{th}$ amplifier RF signals to form the RF output signal.

20. The method of amplifying an RF signal of claim 17, wherein the setting of the first through $N^{th}$ bias voltages on the first through $N^{th}$ power amplifiers, and the generating of the RF output signal by the first through $N^{th}$ power amplifiers are both performed on the same die.

* * * * *